United States Patent
Wiktor et al.

(10) Patent No.: US 11,264,897 B2
(45) Date of Patent: Mar. 1, 2022

(54) PULSE WIDTH MODULATOR DELAY CONTROL CIRCUIT

(71) Applicant: TEXAS INSTRUMENTS INCORPORATED, Dallas, TX (US)

(72) Inventors: Stefan Wlodzimierz Wiktor, Raleigh, NC (US); Brian Thomas Lynch, Brookline, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 89 days.

(21) Appl. No.: 16/562,012

(22) Filed: Sep. 5, 2019

(65) Prior Publication Data

US 2020/0228011 A1   Jul. 16, 2020

Related U.S. Application Data

(60) Provisional application No. 62/791,947, filed on Jan. 14, 2019.

(51) Int. Cl.
*H02M 3/157* (2006.01)
*H03K 7/08* (2006.01)
*H02M 1/08* (2006.01)
*H02M 3/158* (2006.01)
*H03K 7/06* (2006.01)

(52) U.S. Cl.
CPC ............ *H02M 3/157* (2013.01); *H02M 1/08* (2013.01); *H02M 3/158* (2013.01); *H03K 7/06* (2013.01); *H03K 7/08* (2013.01)

(58) Field of Classification Search
CPC ........ H02M 3/157; H02M 1/08; H02M 3/158; H02M 2001/0025; H03K 7/08; H03K 7/06
See application file for complete search history.

(56) References Cited

U.S. PATENT DOCUMENTS

| | | | |
|---|---|---|---|
| 7,726,877 B1 * | 6/2010 | Avitan | G01K 7/015 374/170 |
| 9,306,548 B1 | 4/2016 | Wiktor et al. | |
| 9,991,777 B2 | 6/2018 | Lynch et al. | |
| 10,063,143 B1 * | 8/2018 | Fan | H02M 3/156 |
| 10,075,073 B2 * | 9/2018 | Guan | H02M 3/158 |
| 10,917,005 B2 * | 2/2021 | Wiktor | H02M 3/158 |
| 2004/0140719 A1 * | 7/2004 | Vulih | H02M 1/15 307/80 |
| 2007/0063682 A1 * | 3/2007 | Dagher | H02M 3/157 323/282 |
| 2007/0296386 A1 * | 12/2007 | Umeki | H02M 3/1588 323/284 |
| 2010/0301827 A1 * | 12/2010 | Chen | H02M 3/156 323/299 |

(Continued)

*Primary Examiner* — Kyle J Moody
(74) *Attorney, Agent, or Firm* — Michelle F. Murray; Charles A. Brill; Frank D. Cimino

(57) ABSTRACT

A switching power supply controller includes a pulse width modulator circuit. The pulse width modulator circuit includes a delay circuit and a delay control circuit coupled to the delay circuit. The delay control circuit includes an amplifier circuit. The amplifier circuit includes a first input terminal, a second input terminal, and an output terminal. The first input terminal is coupled to a first voltage reference terminal. The second input terminal is coupled to the second voltage reference terminal. The output terminal is coupled to a control terminal of the delay circuit.

20 Claims, 7 Drawing Sheets

(56) References Cited

U.S. PATENT DOCUMENTS

| 2013/0135775 A1* | 5/2013 | Yao | H02M 3/33515 |
| | | | 361/18 |
| 2018/0278045 A1* | 9/2018 | Watanabe | H02H 7/1213 |
| 2019/0238054 A1* | 8/2019 | Flaibani | H03K 7/06 |

* cited by examiner

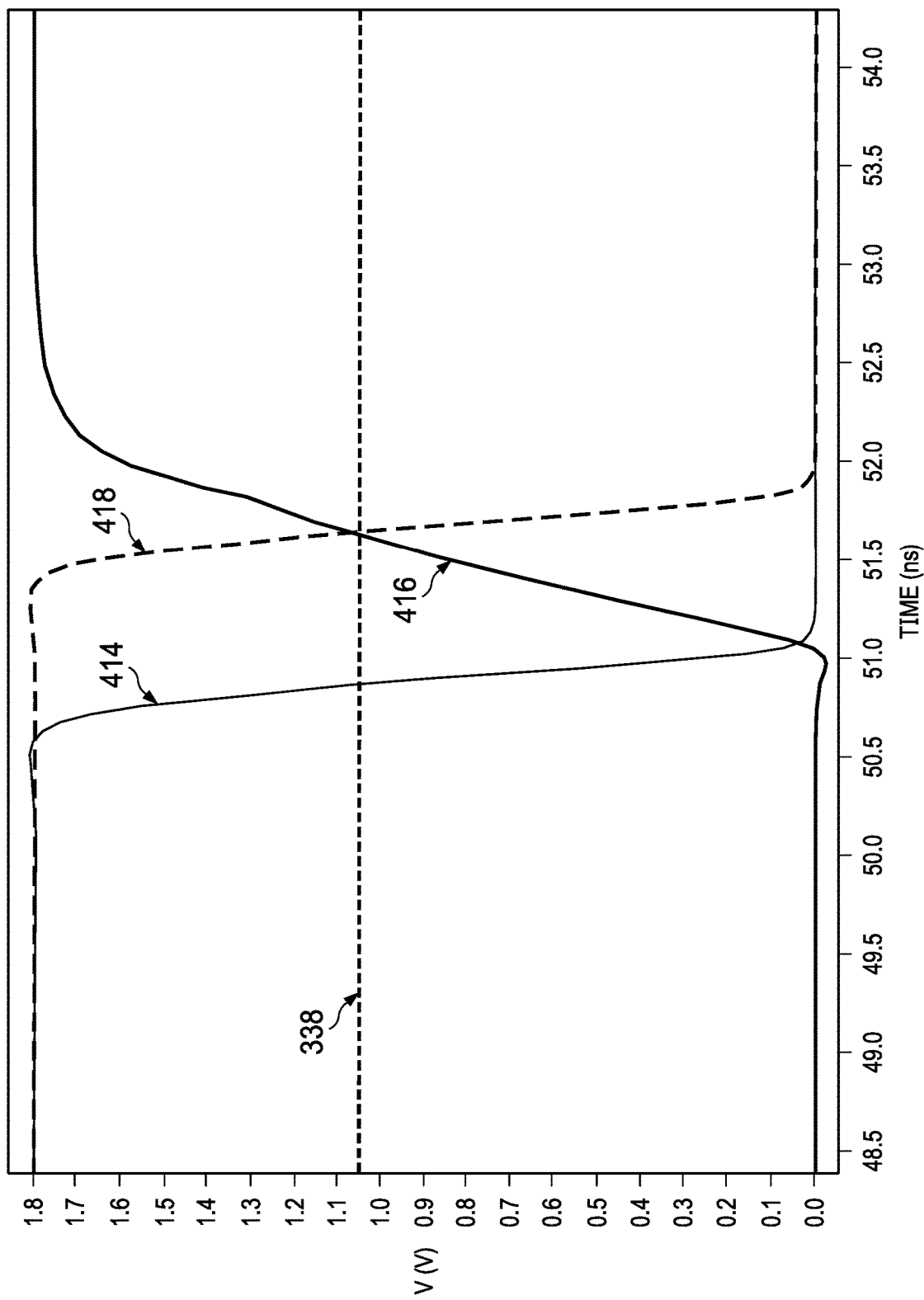

PULSE WIDTH MODULATOR DELAY CONTROL CIRCUIT

CROSS-REFERENCE TO RELATED APPLICATIONS

The present application claims priority to U.S. Provisional Patent Application No. 62/791,947, filed Jan. 14, 2019, entitled "Fixed Frequency Converter with PFM to CCM Transition," which is hereby incorporated herein by reference in its entirety.

BACKGROUND

A switch-mode power supply is an electronic circuit that converts an input direct current (DC) supply voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter.

A switch-mode power supply may be operated in different control modes, where selection of a control mode is based on operating conditions, such as the power demanded by the load. For example, when load power demands are relatively high a switch-mode power supply may operate in continuous conduction mode, and when load power demands are relatively low the switch-mode power supply may operate in discontinuous mode or pulse frequency modulation mode to improve efficiency.

SUMMARY

A switching power supply controller and switching power supply that employ a delay circuit to control pulse width when transitioning from pulse frequency modulation mode to fixed frequency continuous conduction mode are disclosed herein. In one example, a switching power supply controller includes a pulse width modulator circuit. The pulse width modulator circuit includes a delay circuit and a delay control circuit coupled to the delay circuit. The delay control circuit includes an amplifier circuit. The amplifier circuit includes a first input terminal, a second input terminal, and an output terminal. The first input terminal is coupled to a first voltage reference terminal. The second input terminal is coupled to the second voltage reference terminal. The output terminal is coupled to a control terminal of the delay circuit.

In another example, a switching power supply controller includes a pulse width modulator circuit. The pulse width modulator circuit includes a delay control circuit and a delay circuit configured generate a delay that defines a width of pulses generated by the pulse width modulator circuit. The delay control circuit is coupled to the delay circuit. The delay control circuit is configured to generate a control voltage that sets a propagation delay of the delay circuit. The delay control circuit includes an amplifier circuit and a voltage reference circuit. The amplifier circuit is configured to generate the control voltage during continuous conduction mode operation. The voltage reference circuit is configured to generate the control voltage during pulse frequency modulation mode operation.

In a further example, a switching power supply includes an inductor, a switching transistor, and a switching power supply controller. The switching transistor is coupled to the inductor. The switching power supply controller is coupled to the switching transistor. The switching power supply controller includes a first voltage reference circuit and a pulse width modulator circuit. The pulse width modulator circuit includes a delay control circuit and a delay circuit that is coupled to the delay control circuit. The delay control circuit includes a second voltage reference circuit and an amplifier circuit. The amplifier circuit includes a first input terminal, a second input terminal, a third input terminal, a fourth input terminal, and an output terminal. The first input terminal is coupled to the inductor. The second input terminal is coupled to the first voltage reference circuit. The third input terminal is coupled to the second voltage reference circuit. The fourth input terminal is coupled to the second voltage reference circuit. The output terminal is coupled to a control terminal of the delay circuit.

BRIEF DESCRIPTION OF THE DRAWINGS

For a detailed description of various examples, reference will now be made to the accompanying drawings in which:

FIGS. 4C and 4D show example signals produced by operation of the delay cell of FIG. 4A;

DETAILED DESCRIPTION

The term "couple" is used throughout the present disclosure. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Figure 1:
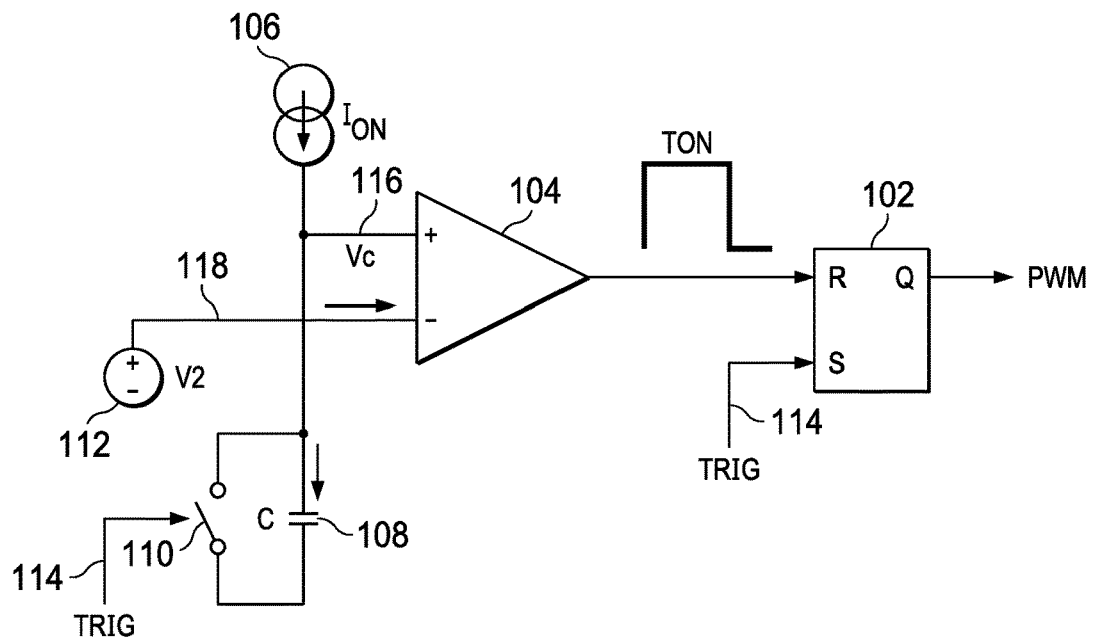
FIG. 1 shows a schematic diagram for an example pulse width modulator suitable for use in a switching power supply.

In switching power supplies that implement both continuous conduction mode (CCM) and pulse frequency modulation (PFM) mode, the transition from PFM to CCM is carefully controlled to avoid generation of transients in the output voltage. FIG. 1 shows a schematic diagram for an example pulse width modulator 100 that may be used in a switching power supply that implements CCM and PFM. The pulse width modulator 100 includes an SR latch 102, a comparator 104, a current source 106, a capacitor 108, a switch 110, and a voltage source 112. The SR latch 102 is set by the TRIG signal 114 to initiate generation of a pulse that enables charging of an inductor in a switching power supply. The TRIG signal 114 also closes the switch 110 to discharge the capacitor 108. When the TRIG signal 114 falls, and the switch 110 is opened, the current flow from the current source 106 charges the capacitor 108 to generate the voltage ramp 116. The comparator 104 compares the voltage ramp 116 to the control voltage 118 provided by the voltage source 112. The voltage source 112 may generate the control voltage 118 based on power supply input voltage, the power supply output voltage, and other factors. Additionally, temperature and process variance may affect the values of the control voltage 118 and the voltage ramp 116. When the voltage ramp 116 exceeds the control voltage 118, the comparator 104 resets the SR latch 102 to terminate the pulse initiated by the TRIG signal 114.

Figure 2:
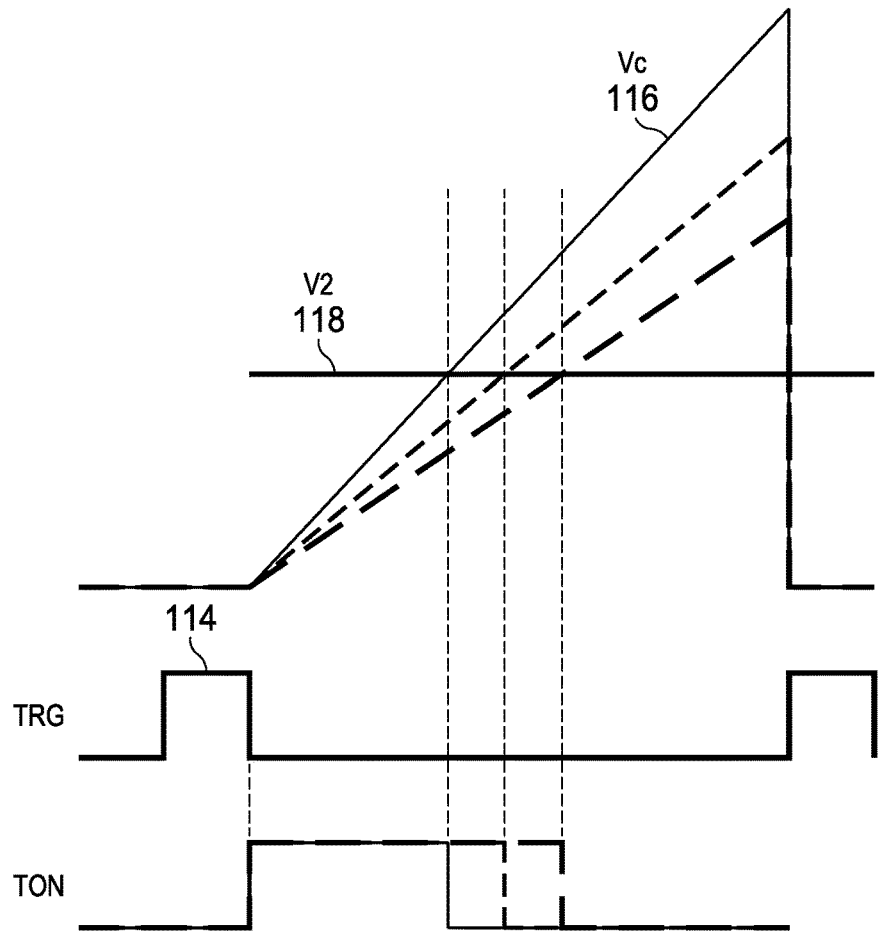
FIG. 2 shows an example of signals generated in the pulse width modulator of FIG. 1.

FIG. 2 shows an example of signals generated in the pulse width modulator 100. The TRIG signal 114 discharges the capacitor 108 to reset generation of the voltage ramp Vc. When the TRIG signal 114 is deactivated, the voltage of the voltage ramp 116 increases. When the voltage ramp 116 exceeds the control voltage 118, the pulse output of the SR latch 102 is deactivated. As shown in FIG. 2, the length of the pulse is determined by the control voltage 118 and the voltage ramp 116. The value of the control voltage 118 needed to generate a desired pulse width is a function of the input voltage, the output voltage, and the switching frequency of the pulse width modulator 100.

To transition from PFM to CCM operation, to maintain an accurate output voltage, the pulse width modulator 100 must determine the operating conditions (the duty cycle) of the pulse width modulator 100, and set the control voltage 118 (e.g., as a function of input voltage, output voltage, and the switching period of the pulse width modulator 100) to produce the desired duty cycle. Some implementations of the pulse width modulator 100 attempt to provide a same pulse width across CCM-PFM transitions by storing a sample of the control voltage 118 at the transition from CCM to PFM and applying the sample of the control voltage 118 to control pulse width at the transition from PFM to CCM.

However, because the control voltage 118 and/or the voltage ramp 116 are affected by a variety of factors (e.g., input voltage and output voltage) the stored value of the control voltage 118 may not provide the desired pulse width, resulting in an undesirable transient at the transition from PFM to CCM. Furthermore, the values of the control voltage 118 and the voltage ramp 116 applied to produce a desired pulse width vary with temperature and semiconductor manufacturing process. Therefore, the value of the control voltage 118 applied to produce a desired pulse width must be compensated for process and temperature.

Figure 3:
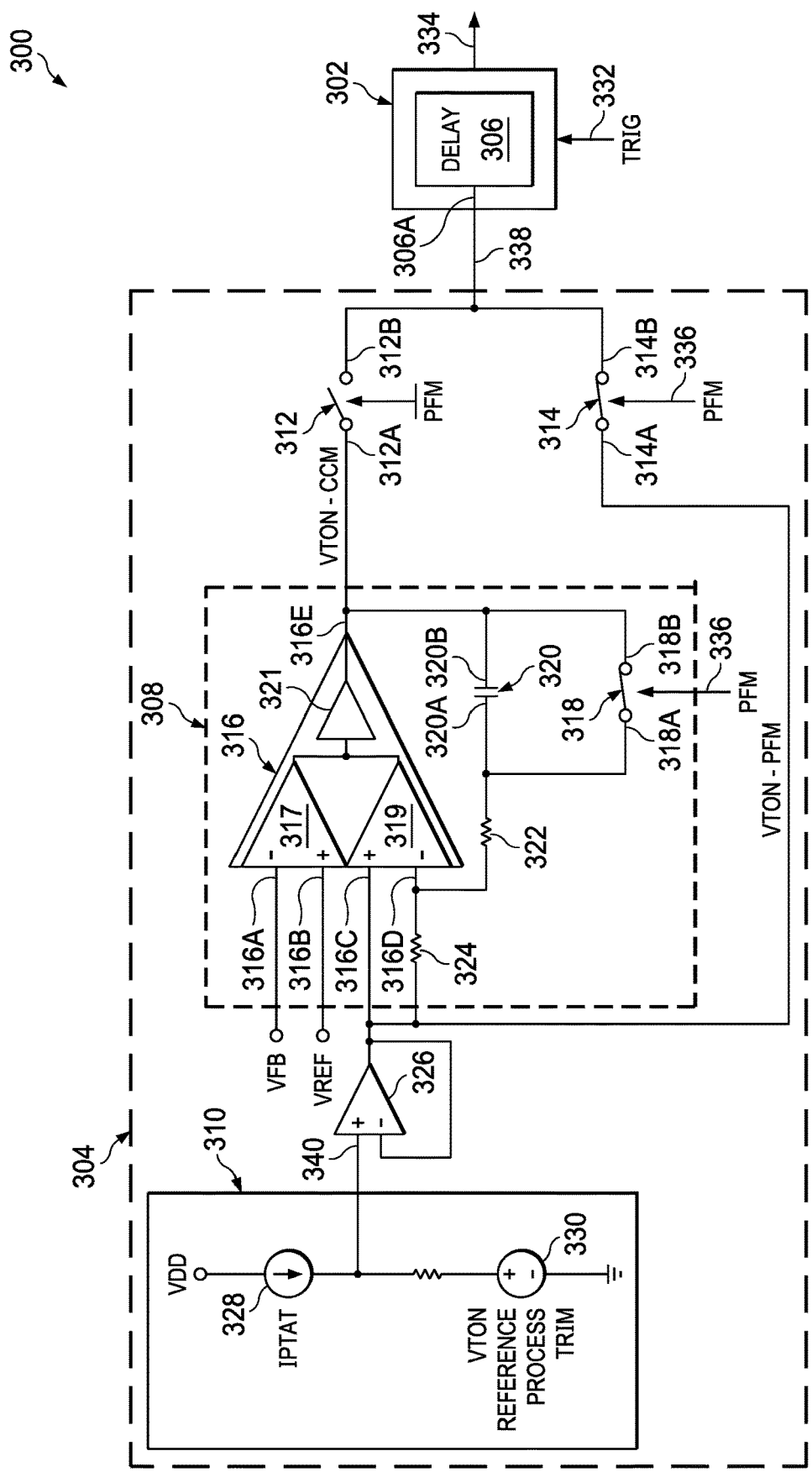
FIG. 3 shows a schematic diagram for an example pulse width modulator in accordance with this description.

FIG. 3 shows a schematic diagram for an example pulse width modulator circuit 300 in accordance with this description. The pulse width modulator circuit 300 includes a pulse circuit 302 and a delay control circuit 304. The pulse circuit 302 includes a delay circuit 306 that is coupled to the delay control circuit 304. That is, the delay control circuit 304 controls the pulse width provided by the delay circuit 306. The pulse circuit 302 may include additional components, such a set-reset (SR) latch that is set by the trigger signal 332 and reset by a delayed version of the trigger signal 332 (delayed by the delay circuit 306) to generate a pulse signal 334. The delay circuit 306 includes multiple (e.g., 256 or more) delay cells connected in series to provide a configurable delay. The delay produced by each of the delay cells is controlled by the delay control circuit 304, via the delay control signal 338.

Figure 4A:
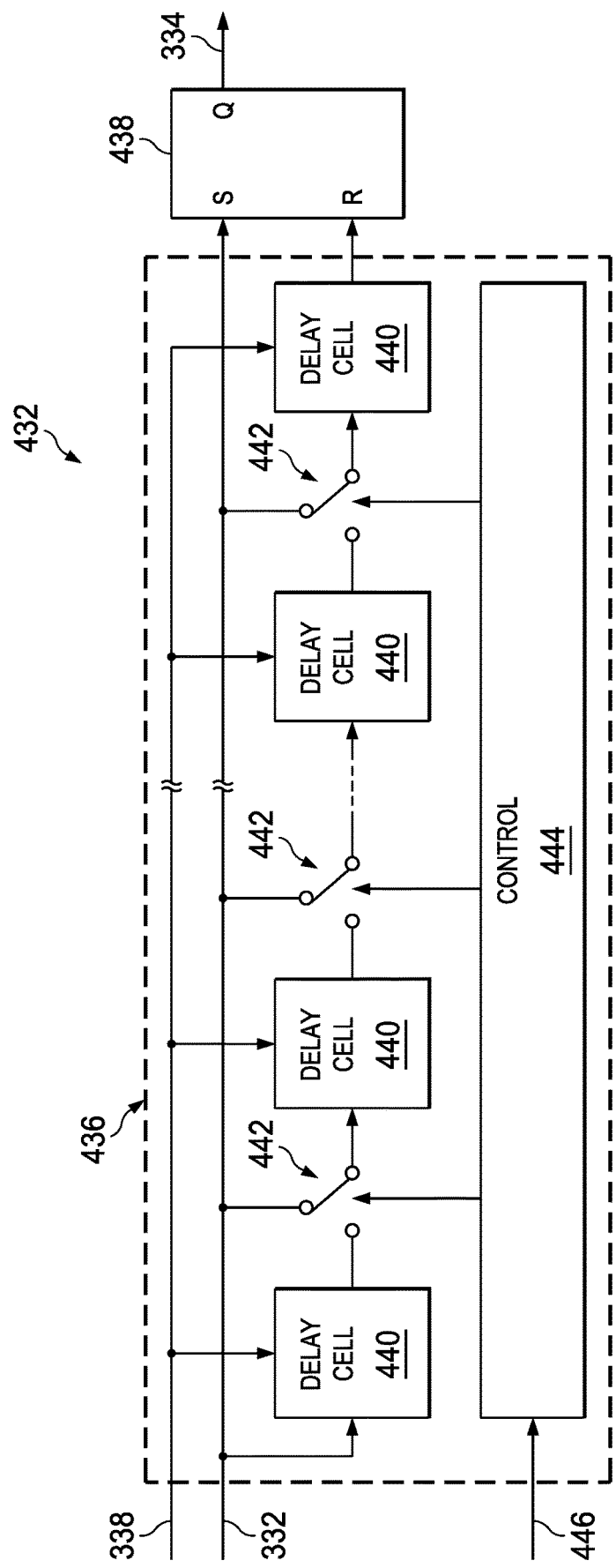
FIG. 4A shows a block diagram for an example pulse circuit suitable for used in the pulse width modulator of FIG. 3.

FIG. 4A shows an example pulse circuit 432. The pulse circuit 432 is an implementation of the pulse circuit 302. The pulse circuit 432 includes a delay circuit 436 and an SR latch 438. The delay circuit 436 is an implementation of the delay circuit 306. The delay circuit 436 includes multiple delay cells 440 connected in series. A switch 442 connects each delay cell 440 to a successive delay cell 440. To a given delay cell 440, the switch 442 routes either the trigger signal 332 or the output of the preceding delay cell 440. Thus, the number of delay cells 440 applied to delay the trigger signal 332 is controlled. The 444 sets the switches 442 based on a digital pulse width control value 446 that specifies the number of the delay cells 440 to be applied to delay the trigger signal 332. The SR latch 438 is set by the trigger signal 332 to activate the pulse signal 334 and reset by output of the delay circuit 436 to deactivate the pulse signal 334.

The digital pulse width control value 446 may be generated as a function of the input voltage (e.g., VIN shown in FIG. 5) provided to a switching power supply (e.g., the switching power supply 500 show in FIG. 5) that includes the pulse circuit 432. Circuitry included in the switching power supply 500 may measure the input voltage (VIN) and select a value of the digital pulse width control value 446 based on the measure input voltage. For example, if the input voltage increases, then the value of the digital pulse width control value 446 decreases to reduce the number of the delay cells 440 applied, reduce the delay generated by the pulse circuit 432, and reduce the width of the pulse signal 334. Similarly, if the input voltage decreases, then the value of the digital pulse width control value 446 increases to increase the number of the delay cells 440 applied, increase the delay generated by the pulse circuit 432, and increase the width of the pulse signal 334.

Figure 4B:
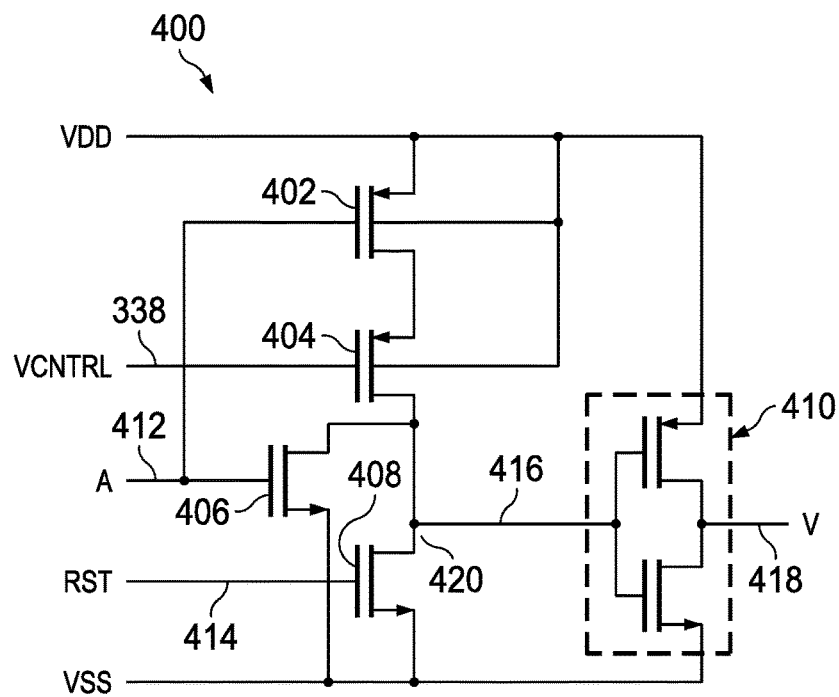
FIG. 4B shows a schematic diagram for an example delay cell suitable for use in the pulse width modulator of FIG. 3.

In addition to selecting the number of delay cells 440 used to delay the trigger signal 332, the delay provided by the delay circuit 436 is controlled by setting the amount of delay provided by each delay cell 440. The delay control signal 338, which is an analog signal, controls the delay of each of the delay cells 440. FIG. 4B shows an example delay cell 400 suitable for use in the delay circuit 306. The 400 is an implementation of the delay cell 440. The delay cell 400 includes P channel MOSFETs 402 and 404, N-channel MOSFETs 406 and 408, and inverter 410. The delay control signal 338 is applied to the P channel MOSFET 404 to control the delay of the delay cell 400 by controlling the resistance of the P channel MOSFET 404. The N-channel MOSFET 408 is coupled to the P channel MOSFET 404 and pulls down the input of the inverter 410 responsive to the input signal 414 (e.g., a pulse signal to be delayed). The input signal 414 may be the trigger signal 332 or a delayed version thereof as illustrated in FIG. 4A. When the input signal 414 transitions from "high" to "low," the N-channel MOSFET 408 turns off, and current flowing through the P-channel MOSFET 404 charges the capacitance at the node 420. As noted above, the resistance of the P-channel MOSFET 404, and the current flowing through the P-channel MOSFET 404, is controlled by the delay control signal 338. Activation of the N-channel MOSFET 406, via the signal 412, places the delay cell 400 in an inactive state. For example, if an instance of the delay cell 400 is not being used, then the delay cell may be deactivated to conserve power. Some implementations of the delay cell 400 may provide a delay, controllable by the delay control signal 338, in a range of about 0.6 nanoseconds to about 1.2 nanoseconds.

Figure 4C:
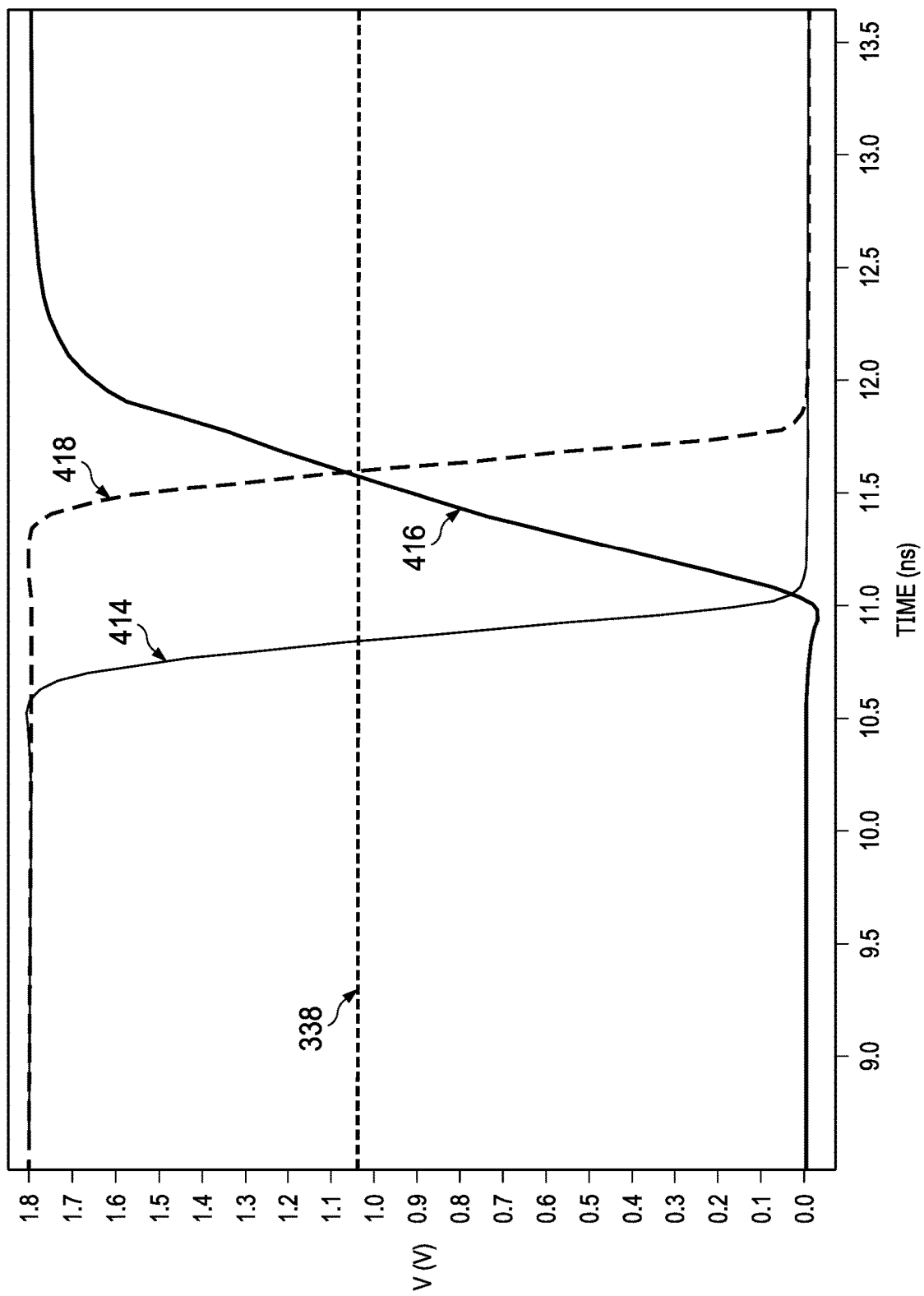

FIGS. 4C and 4D show examples of operation of the delay cell 400. In FIG. 4C, the delay control signal 338 is set to 1.04 volts. The input signal 414 transitions from "high" to "low," and the voltage 416 at the node 420 rises. The output signal 418 transitions from "high" to "low" about 764 picoseconds after the input signal 414. In FIG. 4D, the delay control signal 338 is set to about 1.05 volts (10 millivolts higher than in FIG. 4C), which increases the resistance of the P-channel MOSFET 404, and increases the delay from the transition of the input signal 414 to the transition of the output signal 418 to about 792 picoseconds.

Returning to FIG. 3, the delay control circuit 304 includes an amplifier circuit 308, a voltage reference circuit 310, a switch 312, a switch 314, and a buffer circuit 326. The switch 312 couples the amplifier circuit 308 to the delay circuit 306, and the switch 314 couples the voltage reference circuit 310, via the buffer circuit 326, to the delay circuit 306. When the pulse width modulator circuit 300 is operating in CCM mode, the switch 312 is closed and the switch 314 is open, and the amplifier circuit 308 sets the delay of the delay circuit 306. When the pulse width modulator circuit 300 is operating in PFM mode, the switch 312 is open and the switch 314 is closed, and the voltage reference circuit 310 sets the delay of the delay circuit 306. The switch 312 includes a terminal 312B that is coupled to the control terminal 306A of the delay circuit 306, and the switch 314 includes a terminal 314B that is coupled to the control terminal 306A of the delay circuit 306. The switch 314 is controlled by the PFM signal 336, which is active when the pulse width modulator is operating in PFM mode. The switch 312 is controlled by an inverted version of the PFM signal so that opening and closing of the switch 312 and the switch 314 is complementary. The buffer circuit 326 is a unity gain amplifier that buffers the output voltage 340 of the voltage reference circuit 310 for input to the amplifier circuit 308 and the delay circuit 306.

The amplifier circuit 308 includes an amplifier 316, a switch 318, a feedback capacitor 320, a resistor 322 and a resistor 324. The amplifier 316 includes a transconductance amplifier 317, and a transconductance amplifier 319, and a buffer amplifier 321. Outputs of the transconductance amplifier 317 and the transconductance amplifier 319 are summed, and buffered by the buffer amplifier 321 to produce the output signal of the amplifier 316. The amplifier 316 includes input terminals 316A and 316B for providing input to the transconductance amplifier 317, and input terminals 316C and 316D for providing input to the transconductance amplifier 319. The input terminal 316A receives a power supply feedback voltage (VFB) that is indicative of the output voltage of a switching power supply that includes the pulse width modulator circuit 300. The input terminal 316B receives a reference voltage (VREF) for comparison to the feedback voltage. The input terminal 316C is coupled to the voltage reference circuit 310 via the buffer circuit 326, and the input terminal 316D is coupled to the voltage reference circuit 310 via the resistor 324 and the buffer circuit 326.

The feedback capacitor 320 and the resistor 322 are coupled in series between the output terminal 316E of the amplifier 316 and the input terminal 316D of the amplifier 316. The feedback capacitor 320 includes a terminal 320B coupled to the output terminal 316E of the amplifier 316, and a terminal 320A coupled to the input terminal 316D of the amplifier 316 via the resistor 322. The switch 318 is connected across the feedback capacitor 320. The switch 318 is controlled by the PFM signal 336 and includes a terminal 318A coupled to the terminal 320A of the feedback capacitor 320, and a terminal 318B coupled to the terminal 320B of the feedback capacitor 320. The switch 318 is closed when the pulse width modulator circuit 300 is operating in PFM and is open when the pulse width modulator circuit 300 is operating in CCM.

Thus, when the pulse width modulator circuit 300 is operating in PFM mode, the output voltage 340 of the voltage reference circuit 310 sets the delay produced by the delay circuit 306, and the amplifier circuit 308 bypass the feedback capacitor 320 to fix the gain of the amplifier 316 via the resistor 322 and resistor 324. While the pulse width modulator circuit 300 is operating in PFM mode, the switch 318 bypasses the capacitor 320 and the amplifier circuit 308 generally follows the output voltage 340 of the voltage reference circuit 310 because the feedback voltage and the reference voltage at inputs 316A and 316B cancel. Thus, when the pulse width modulator circuit 300 transitions from PFM mode to CCM mode, the control voltage provided to the delay circuit 306 by the amplifier circuit 308 is set to the output voltage 340 of the voltage reference circuit 310. While operating in CCM, the average voltage of the delay control signal 338 provided to the delay circuit 306 by the amplifier circuit 308 is the same voltage as the output voltage 340 of the voltage reference circuit 310. Thus, the delay provided by the delay circuit 306, and in turn the pulse width produced by the pulse circuit 302, is controlled at the transition from PFM to CCM.

The voltage reference circuit 310 compensates the output voltage 340 for process and temperature to ensure that the output voltage 340 produces the desired delay, and the pulse circuit 302 produces the desired pulse width, across process and temperature variations. The voltage reference circuit 310 includes a proportional to absolute temperature (PTAT) current source 328 and a voltage source 330. The voltage source 330 is trimmed at manufacture to compensate for process variation, and the current generated by the 328 varies with temperature to compensate the output voltage 340 for temperature changes.

Figure 5:
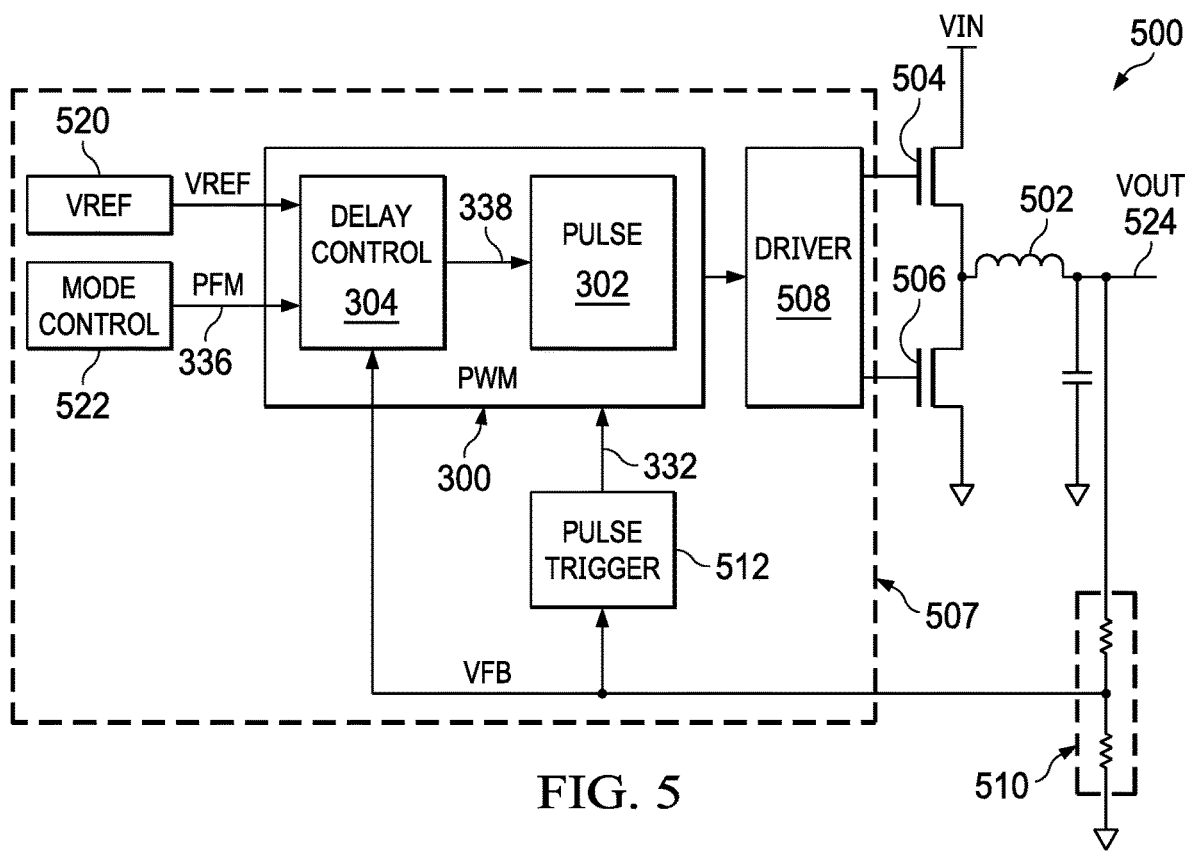
FIG. 5 shows a block diagram for an example switching power supply in accordance with this description.

FIG. 5 shows a block diagram for an example switching power supply 500 in accordance with this description. The switching power supply 500 operates in CCM mode or PFM mode based on the current needs of a load circuit powered by the switching power supply 500. The switching power supply 500 includes an inductor 502, a high-side switching transistor 504, a low-side switching transistor 506, and a switching power supply controller 507. The inductor 502 is coupled to the high-side switching transistor 504 and the low-side switching transistor 506. The high-side switching transistor 504 and the low-side switching transistor 506 control charging and discharging of the inductor 502. The switching power supply controller 507 is coupled to the high-side switching transistor 504 and the low-side switching transistor 506, and controls switching of the high-side switching transistor 504 and the low-side switching transistor 506 based the output voltage 524 of the switching power supply 500 fed back to the switching power supply controller 507 via the voltage divider 510.

The switching power supply controller 507 is coupled to the high-side switching transistor 504 and the low-side switching transistor 506, and includes a driver circuit 508, a pulse trigger circuit 512, an instance of the pulse width modulator circuit 300, a voltage reference circuit 520, and a mode control circuit 522. The pulse width modulator circuit 300 is coupled to the driver circuit 508, the pulse trigger circuit 512, the voltage reference circuit 520, and the mode control circuit 522. The pulse width modulator circuit 300 generates the pulses that control switching of the high-side switching transistor 504 and the low-side switching transistor 506. The driver circuit 508 provides voltage and current for driving the pulses to the high-side switching transistor 504 and the low-side switching transistor 506. The pulse trigger circuit 512 triggers generation of a pulse by the pulse width modulator circuit 300 based on the output voltage 524 of the switching power supply 500, an input voltage of the switching power supply 500, and/or a desired switching frequency of the switching power supply 500. For example, the pulse trigger circuit 512 may trigger pulse generation at a fixed frequency when the switching power supply 500 is operating in CCM mode, and trigger pulse generation based on the output voltage 524 when the switching power supply 500 is operating in PFM mode. The mode control circuit 522 generates the PFM signal 336 for selecting PFM or CCM operation based on the load current drawn from the switching power supply 500. The voltage reference circuit 520 generates a reference voltage for use by the pulse width modulator circuit 300.

The pulse width modulator circuit 300 includes a delay control circuit 304 and the pulse circuit 302. The pulse circuit 302 includes delay cells that are controlled by the delay control signal 338 generated by the delay control circuit 304. The delay control signal 338 controls the pulse width produced by the pulse width modulator circuit 300 to reduce or prevent disruption of the output voltage 524 when the switching power supply 500 transitions from PFM operation to CCM operation.

Figure 6:
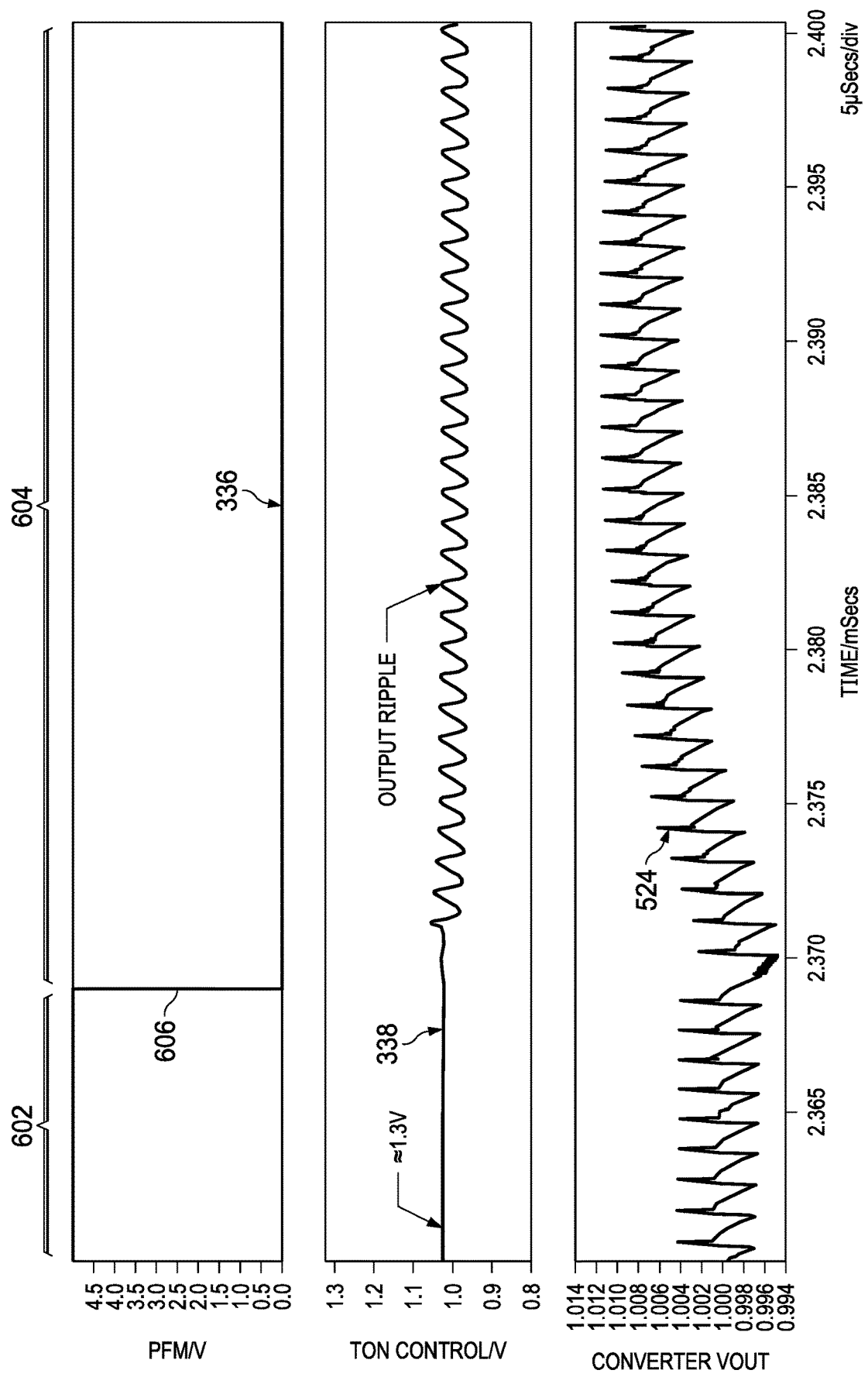
FIG. 6 shows example signals for generated in the switching power supply of FIG. 5.

FIG. 6 shows example signals in the switching power supply 500. The PFM signal 336 controls the operational mode of the switching power supply 500. For example, when the load current is below a predetermined value the PFM signal 336 is active to cause the switching power supply 500 to operate in PFM mode, and when the load current is above the predetermined value, the PFM signal 336 is inactive to cause the switching power supply 500 to operate in CCM mode. In interval 602, the PFM signal 336 is active and the switching power supply 500 is operating in PFM mode. In interval 604, the PFM signal 336 is inactive and the switching power supply 500 is operating in CCM mode. The delay control signal 338 controls the delay provided by the delay circuit 306. In interval 602, while operating in PFM mode, the switch 314 is closed, and the delay control signal 338 is set to the output voltage 340 generated by the voltage reference circuit 310. At 606, the switch 314 and the switch 318 are opened and the switch 312 closes as the switching power supply 500 transitions from PFM mode to CCM mode. At the transition from PFM to CCM, the delay control signal 338 produces a delay in the delay circuit 306 that generates a pulse width for CCM operation that does not cause a transient in the output voltage 524 of the switching power supply 500. In the interval 604, the output ripple of the switching power supply 500 is reflected in the delay control signal 338, but the average voltage of the delay control signal 338 is the same in PFM mode and CCM mode.

Implementations of the pulse width modulator circuit 300, control the width of generated pulses to provide disturbance free transition from PFM mode to CCM with any input voltage, output voltage, and operating temperature. In PFM mode, pulse width is controlled by applying a reference voltage to set the delay provided by a delay circuit 306, where the delay determines the pulse width. The reference voltage is compensated for temperature and process variation to ensure disturbance free PFM-CCM transitions. In CCM mode, the pulse width is controlled by output of an amplifier circuit 308 that follows the reference voltage while in PFM mode. Thus, at the transition from PFM mode to CCM mode, the output of the amplifier circuit 308 matches the reference voltage. Because the pulse width modulator circuit 300 controls the pulse width at the PFM-CCM transition based on a reference voltage, the pulse width modulator circuit 300 eliminates the need for circuitry that stores a pulse width for use at the PFM-CCM transition.

Implementations of the pulse width modulator circuit 300 may be applied in fixed-frequency or constant on-time switch-mode power supplies to reduce undesirable transients at transition from PFM mode to CCM, while also reducing circuit complexity by eliminating pulse width storage.

Modifications are possible in the described embodiments, and other embodiments are possible, within the scope of the claims.

What is claimed is:

1. A circuit comprising:
   a delay circuit having a control terminal; and
   a delay control circuit comprising:
      an amplifier having a first amplifier input, a second amplifier input, a third amplifier input, and an amplifier output, the amplifier output coupled to the control terminal; and
      a capacitor having a first capacitor terminal and a second capacitor terminal, the first capacitor terminal coupled to the amplifier output and the second capacitor terminal coupled to the third amplifier input.

2. The circuit of claim 1, wherein the delay control circuit further comprises:
   a switch having a first switch terminal and a second switch terminal, the first switch terminal coupled to the first capacitor terminal and the second switch terminal coupled to the second capacitor terminal.

3. The circuit of claim 1, wherein the delay control circuit further comprises:
   a switch having a first switch terminal and a second switch terminal, the first switch terminal coupled to the amplifier output and the second capacitor terminal coupled to the control terminal.

4. The circuit of claim 1, wherein the delay control circuit further comprises:
   a switch having a first switch terminal and a second switch terminal, the first switch terminal coupled to the second amplifier input and the second switch terminal coupled to the control terminal.

5. The circuit of claim 4, wherein the delay control circuit further comprises:
   a buffer circuit having a buffer input and a buffer output, the buffer input coupled to the second amplifier input and the buffer output coupled to the first switch terminal, to the second amplifier input, and to the third amplifier input.

6. The circuit of claim 1, further comprising:
   a voltage reference circuit coupled to the second amplifier input, the voltage reference circuit comprising a proportional to absolute temperature current source.

7. The circuit of claim 1, wherein the delay circuit comprises:
   a first delay cell having a first delay input, a second delay input, and a first delay output, the first delay input coupled to the second delay input coupled to the control terminal;
   a switch having a first switch terminal, a second switch terminal, and a third switch terminal, the first switch terminal coupled to the first delay output and the second switch terminal coupled to the first delay input; and
   a second delay cell having a third delay input, a fourth delay input, and a second delay output, the second delay output coupled to the third switch terminal and the fourth delay input coupled to the second delay input.

8. A circuit comprising:
a delay circuit configured generate a delay that defines a pulse width; and
a delay control circuit coupled to the delay circuit, the delay control circuit configured to generate a control voltage that sets a propagation delay of the delay circuit, the delay control circuit comprising:
an amplifier circuit configured to generate the control voltage during continuous conduction mode operation; and
a voltage reference circuit configured to generate the control voltage during pulse frequency modulation mode operation.

9. The circuit of claim 8, wherein the delay control circuit comprises a switch configured to connect the amplifier circuit to the delay circuit during continuous conduction mode operation.

10. The circuit of claim 9, wherein the amplifier circuit comprises:
a first input terminal configured to receive a power supply feedback voltage;
a second input terminal configured to receive a first reference voltage;
a third input terminal configured to receive a second reference voltage generated by the voltage reference circuit;
a fourth input terminal configured to receive the second reference voltage generated by the voltage reference circuit; and
an output terminal coupled to the switch.

11. The circuit of claim 10, wherein:
the switch is a first switch; and
the amplifier circuit comprises:
a capacitor coupled to the output terminal of the amplifier circuit and the fourth input terminal of the amplifier circuit; and
a second switch coupled in parallel with the capacitor, the second switch configured to bypass the capacitor during pulse frequency modulation mode operation.

12. The circuit of claim 8, wherein the delay control circuit comprises a switch configured to connect the voltage reference circuit to the delay circuit during pulse frequency modulation mode operation.

13. The circuit of claim 8, wherein the voltage reference circuit is configured to compensate the control voltage for temperature and process variations.

14. The circuit of claim 8, wherein the amplifier circuit is configured to follow an output voltage of the voltage reference circuit during pulse frequency modulation mode operation.

15. A switching power supply, comprising:
an inductor;
a switching transistor coupled to the inductor;
a switching power supply controller coupled to the switching transistor, the switching power supply controller comprising:
a first voltage reference circuit;
a pulse width modulator circuit comprising:
a delay circuit; and
a delay control circuit coupled to the delay circuit, the delay control circuit comprising:
an amplifier having a first amplifier input, a second amplifier input, a third amplifier input, and an amplifier output, the amplifier output coupled to a control terminal; and
a capacitor having a first capacitor terminal and a second capacitor terminal, the first capacitor terminal coupled to the amplifier output and the second capacitor terminal coupled to the third amplifier input.

16. The switching power supply of claim 15, wherein the delay control circuit further comprises:
a switch having a first switch terminal and a second switch terminal, the first switch terminal coupled to the first capacitor terminal and the second switch terminal coupled to the second capacitor terminal.

17. The switching power supply of claim 15, wherein the delay control circuit further comprises:
a switch having a first switch terminal and a second switch terminal, the first switch terminal coupled to the amplifier output and
the second switch terminal coupled to the control terminal.

18. The switching power supply of claim 15, wherein the delay control circuit further comprises:
a switch having a first switch terminal and a second switch terminal, the first switch terminal coupled to a second voltage reference circuit and the second switch terminal coupled to the control terminal.

19. The switching power supply of claim 18, wherein the delay control circuit further comprises:
a buffer circuit having a buffer input and a buffer output, the buffer input coupled to the second voltage reference circuit and the buffer output coupled to the first switch terminal and to the third amplifier input.

20. The switching power supply of claim 19, wherein the second voltage reference circuit comprises a proportional to absolute temperature current source.

* * * * *